United States Patent [19]
Minohoshi et al.

[11] Patent Number: 5,871,610
[45] Date of Patent: Feb. 16, 1999

[54] APPARATUS FOR AUTOMATICALLY MOUNTING A PLURALITY OF SEMICONDUCTOR CHIPS ON A LEAD FRAME

[75] Inventors: Tomio Minohoshi; Toyohiko Takeda; Hideo Numata, all of Yokohama, Japan

[73] Assignee: Kabushiki Kaisha Toshiba, Kawasaki, Japan

[21] Appl. No.: 24,913

[22] Filed: Mar. 2, 1993

Related U.S. Application Data

[63] Continuation of Ser. No. 731,880, Jul. 18, 1991, abandoned.

[30] Foreign Application Priority Data

Jul. 19, 1990 [JP] Japan ..................................... 2-189485

[51] Int. Cl.⁶ ..................................................... B32B 31/00
[52] U.S. Cl. .......................... 156/362; 156/542; 156/556; 29/739; 29/742
[58] Field of Search .................................... 156/556, 362, 156/540, 541, 542; 118/719; 29/739, 740, 741, 742, 833, 834, 835, 836

[56] References Cited

U.S. PATENT DOCUMENTS

| | | | |
|---|---|---|---|
| 3,909,933 | 10/1975 | Doubek, Jr. et al. | 29/836 |
| 4,511,421 | 4/1985 | Kuehn et al. | 156/556 |
| 4,855,007 | 8/1989 | Baxte et al. | 156/381 |
| 4,858,308 | 8/1989 | Komori | 29/743 |

FOREIGN PATENT DOCUMENTS

| | | |
|---|---|---|
| 54-46472 | 4/1979 | Japan . |
| 1-121926 | 8/1989 | Japan . |

*Primary Examiner*—James Sells
*Attorney, Agent, or Firm*—Finnegan, Henderson, Farabow, Garrett & Dunner, L.L.P.

[57] ABSTRACT

Lead frames supplied from a first supply unit are intermittently conveyed in a non-oxidizing atmosphere. An adhesive is supplied from a second supply unit onto islands of the lead frames, and also semiconductor chips are supplied from a third supply unit onto the islands. When one of different kinds of semiconductor chips supplied from the third supply unit is selected, the selected semiconductor chip is held by a holder having a configuration adapted to the selected semiconductor chip. Therefore, transfer means for semiconductor chips includes at least two kinds of holders.

4 Claims, 5 Drawing Sheets

APPARATUS FOR AUTOMATICALLY MOUNTING A PLURALITY OF SEMICONDUCTOR CHIPS ON A LEAD FRAME

This application is a continuation of application Ser. No. 07/731,880, filed Jul. 18, 1991, now abandoned.

BACKGROUND OF THE INVENTION

1. Field of the Invention

The present invention relates to an apparatus for automatically assembling a plurality of semiconductor chips to provide a semiconductor device.

2. Description of the Related Art

FIG. 5 shows a general structure of a resin molded semiconductor device which includes a plurality of semiconductor chips. Reference numeral 51 denotes a lead frame, 52 an IC chip, 53 a transistor chip, 54 metal wire, 55 an adhesive, and 56 molded resin.

The semiconductor device, unlike a hybrid IC, employs lead frame 51 of a monolithic IC. A plurality of different or similar semiconductor chips, such as IC chip 52 and transistor chip 53, are bonded to an island of the lead frame 51. The electrodes of the semiconductor chips are connected to inner leads of the lead frame 51 by means of metal wires 54, thus providing the semiconductor device with a number of functions. This type of semiconductor device has been widely used because of the advantages: automatic fabrication is easily carried out, a good thermal conductivity is attained, efficient use of space is possible, and various kinds of packages are available.

The semiconductor chips are mounted on the island of the lead frame 51, typically, by means of adhesive 55. The adhesive 55 is, for example, electrically conductive paste, solder, gold foil (generally, an opposite surface of a semiconductor chip is plated with gold, and gold foil is rarely used).

FIG. 6 shows a conventional apparatus for automatically assembling the aforementioned semiconductor chips to provide a semiconductor device.

In a lead frame feed unit 61, lead frames are stocked in a magazine or stocked under a stacked state. The stocked lead frames are fed to a lead frame preheating unit 62 one by one and heated to a predetermined temperature. Subsequently, the lead frame is conveyed onto an XY-table 63. A semiconductor chip is fed from a semiconductor chip feed unit 64. The semiconductor chip is then aligned by an aligning unit 65. The chip is bonded to the island of the lead frame disposed on the XY-table. Prior to the bonding, an adhesive is applied to the mounting area of the island of the lead frame by means of an adhesive supply unit 66. A chuck transfer unit 67 is movable along a Y-axis, and transfers semiconductor chips from the semiconductor chip feed unit 64 through the aligning unit 65 onto the island of the lead frame disposed on the XY-table 63, thereby supplying the adhesive from the adhesive supply unit 66 to the island. The semiconductor chip feed unit 64 is so designed as to be able to feed a desired one of different or similar semiconductor chips arranged in the form of a chip tray or a wafer. The semiconductor chips are bonded, for example, in such a manner that similar chips are first bonded to all islands and then different chips are bonded. After bonding the chips to one lead frame, the XY-table 63 approaches a lead frame cooling unit 68 (63' denotes a range of movement of the XY-table 63), and the lead frame is transferred to the cooling unit 68. After the lead frame is cooled to a predetermined temperature, it is stored in a lead frame storing unit (e.g. a magazine) 69. A series of these operations are controlled by a control unit 70.

In general, however, as the adhesives employed to bond the semiconductor chip to the island, an electrically conductive paste or liquid solder has been used. When the conductive paste is used, it is subjected to a normal-temperature treatment and, subsequently, it is subjected to a curing treatment, thereby increasing a bonding strength. In the adhesive supply unit 66, the adhesive is put in a petri dish-like container. The adhesive is transferred from the container to a chuck 71 provided at the top of the chuck transfer unit 67 and then applied to the island of the lead frame. Thus, the range of movement of the XY-table must be wide, and a large space is disadvantageously required. On the other hand, the distance between both ends of the lead frame stage on the XY-table 63 is so short that an atmosphere necessary for manufacture or a non-oxidizing atmosphere cannot be satisfied. Consequently, surface oxidation of solder proceeds, and the wettability required at the time of bonding the chip is degraded, resulting in a low yield of manufactured products. Besides, regarding the productivity, if the XY-table 63 is not situated near the lead frame cooling unit 68 when the bonding of the semiconductor chip is completed, time is wasted to move the XY-table 63 to the vicinity of the lead frame cooling unit 68. Regarding the characteristics of the products, if one lead frame is mounted on the XY-table and a reducing or non-oxidizing atmosphere needs to be created, the structure of the entire apparatus becomes complex owing to the inadequate space. Unless this atmosphere is maintained, the characteristics are degraded due to bad wettability of solder and oxidation of lead frame. As a result, a step of removing the surface oxide must be provided in the subsequent mounting process. On the other hand, in the case where a reducing or non-oxidizing atmosphere is created, the semiconductor chip is exposed to a mixed gas (e.g. a mixture of hydrogen gas and nitrogen gas in a ratio of 1:9) of the reducing or non-oxidizing atmosphere until the bonding of the chips to one lead frame is completed. Some of the chips may be degraded in characteristic by the influence of hydrogen.

FIG. 7 shows in detail the semiconductor chip feed unit 64, aligning unit 65 and chuck transfer unit 67 in the conventional apparatus shown in FIG. 6.

The chuck transfer unit 67 is movable in the Y-direction by means of a ball screw 72. The amount of movement is controlled by the number of rotations (angle) of the ball screw 72. In the top of the chuck transfer unit 67, the chuck 71 is connected to a vacuum line. In the semiconductor chip feed unit 64, predetermined semiconductor chips 74, such as IC chips or transistor chips, are attached to a predetermined sheet 73. Though not shown, the semiconductor chip 74 to be picked up is detected by a TV camera, and the position of the chip 74 is corrected by an XY-table 75 so as to be picked up by the chuck 71. Thereafter, a pin 77 of a pushing unit 76 pushes one of the semiconductor chips, and the chuck 71 holds the pushed chip. The pushed chip is then transferred to the aligning unit 65. The chip is placed on an aligning table of the aligning unit 65. In order to bond the chip 74 to the island of the lead frame with high precision, the chip 74 is aligned with an aligning member 78.

It is difficult, however, to change the chuck 71 at the time of assembling the semiconductor chips. Therefore, it is necessary to treat semiconductor chips having different outer sizes by use of a single kind of chuck 71. If the chuck 71 is designed to hold the semiconductor chip having a small outer size, it cannot surely hold the semiconductor chip having a large outer size. In other words, deficient chucking occurs to provide a semiconductor device without the large mounted chip. As a result, the yield of products may be reduced. Although it is possible to detect the presence/absence of the semiconductor chip and to stop the operation of the apparatus if the chuck does not hold the chip, this decreases the operational efficiency of the apparatus and deteriorates the productivity. In addition, since the top of the chuck 71 is in contact with the electrode wiring layers of the semiconductor chip, the wiring surface is contaminated. In particular, a fine wiring pattern is damaged by contamination, resulting in a decrease in yield. It is also possible to use a recessed chuck so as not to contact the surface of the semiconductor chip. However, a plurality of semiconductor chips having different outer sizes must be treated by the single kind of chuck 71.

As has been described above, in the conventional semiconductor manufacturing apparatus, electrically conductive paste or liquid solder has been used as an adhesive. The adhesive is transferred by a chuck and supplied onto an island of a lead frame. In addition, the range of movement of the XY-table is wide, and efficient use of space is difficult. Thus, a reducing or non-oxidizing atmosphere is difficult to create, and the wettability of the semiconductor chip at the time of bonding is degraded. Consequently, the yield of products decreases and the quality of products deteriorates. On the other hand, if the reducing or non-oxidizing atmosphere is created, the structure of the apparatus is complicated.

Furthermore, the conventional semiconductor manufacturing apparatus is provided with only a single kind of chuck. If the chuck is designed to treat the semiconductor chip with a small outer size, it hardly holds or transfers the chip with a large outer size. If the apparatus is provided with a function of detecting the presence/absence of the semiconductor chip, the operational efficiency of the apparatus is lowered and the productivity is deteriorated.

SUMMARY OF THE INVENTION

An object of the present invention is, therefore, to provide a semiconductor manufacturing apparatus for surely chucking and transferring different kinds of semiconductor chips.

Another object of the invention is to provide a semiconductor manufacturing apparatus having a reducing or non-oxidizing atmosphere, without a complicated structure.

According to an aspect of the invention, a lead frame is supplied from a first supply unit and is intermittently conveyed by a conveying unit in a reducing or non-oxidizing atmosphere. An adhesive is supplied onto an island of the lead frame by means of a second supply unit located above the conveying unit, and a plurality of semiconductor chips are mounted on the island. The semiconductor chips to be mounted are selected by a third supply unit which has a plurality of semiconductor chips. The chips to be mounted are aligned with an aligning unit. When the semiconductor chips are selected, the chips are held by holders each having a configuration adapted to the size of the chips, and the chips are transferred by a transfer unit. Therefore, the transfer unit includes a holding unit having at least two holders.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENT

An embodiment of the present invention will now be described in detail with reference to the accompanying drawings.

Figure 1:
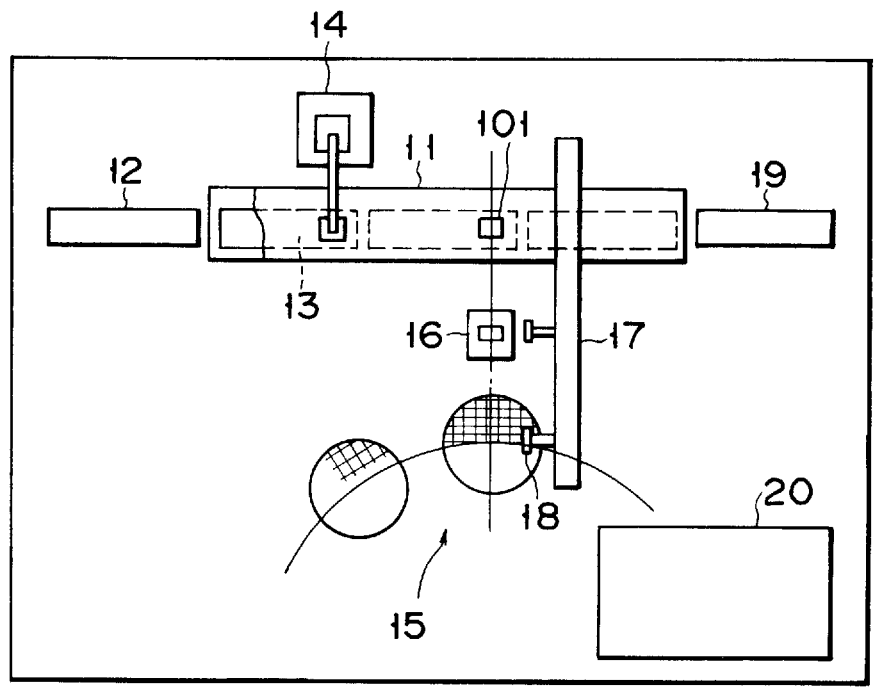
FIG. 1 is a plan view of a semiconductor manufacturing apparatus according to an embodiment of the present invention.

FIG. 1 shows a semiconductor manufacturing apparatus according to an embodiment of the present invention. Reference numeral 11 denotes a lead frame conveying unit, 12 a lead frame feed unit (a first supply unit), 13 a lead frame, 14 an adhesive supply unit (a second supply unit), 15 a semiconductor chip feed unit (a third supply unit), 16 an aligning unit, 17 a chuck transfer unit, 18 a chuck holder, 19 a lead frame storing unit, 20 a control unit, and 101 a mount portion (a bonding portion).

Figure 2:
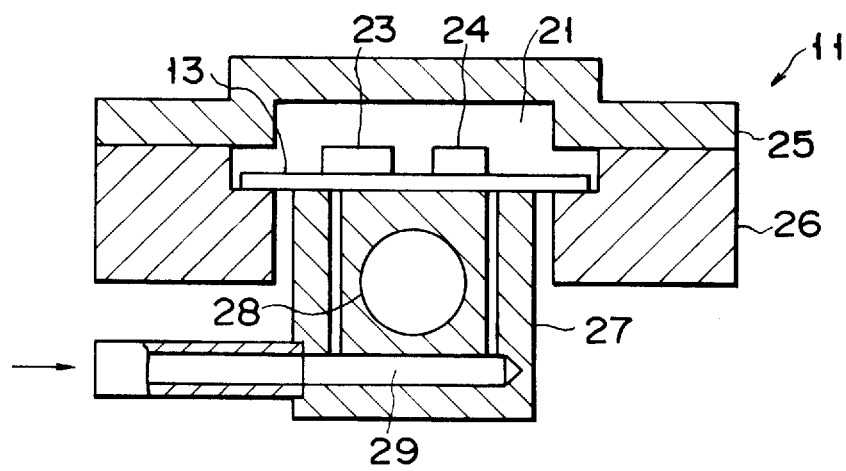
FIG. 2 is a cross-sectional view showing a transfer path of a lead frame.

In the lead frame conveying unit 11, the lead frame fed from the lead frame feed unit 12 is intermittently supplied according to the pitch between the islands of the lead frames 13. The lead frame conveying unit 11 includes a tunnel 21 serving as a conveying path for the lead frame, for example, as shown in FIG. 2. A reducing gas or non-oxidizing gas is introduced into the tunnel 21, thereby isolating the external atmosphere. Reference numeral 23 denotes an IC chip, 24 a transistor chip, 25 a tunnel cover, 26 a guide, 27 a heater block, 28 a heater, and 29 a gas passage. The reducing or non-oxidizing gas is, for example, an inert gas (a mixed gas of hydrogen and oxygen, nitrogen gas, etc.). The adhesive supply unit 14 is not provided along the transfer path (Y-axis) of the chuck transfer unit 17, but is provided at a solder station along the transfer path (X-axis) of the lead frame feed unit 11. The lead frame conveying unit 11 has a mount portion or bonding station 101, and a semiconductor chip is fed onto the mount portion 101 from the semiconductor chip feed unit 15 by means of the chuck transfer unit 17. The reducing or non-oxidizing atmosphere is present in the lead frame conveying unit 11 at and between the solder station, at which the adhesive supply unit 14 is located, and the bonding station 101. A cooling unit is provided at an outlet of the lead frame conveying unit 11, and the lead frame 13, after bonded to the semiconductor chip, is cooled. For example, if the lead frame 13 is made of a copper-based material, the frame 13 is cooled to such a temperature that surface oxidation does not occur when it is exposed to the atmosphere.

According to the above structure, the conveying system for the lead frame 13 conveys the lead frame 13 intermittently from solder station to the bonding station according to the pitch between the islands of the lead frames 13.

Therefore, the transfer loss time required for treating lead frames on the XY-table is reduced to improve the productivity remarkably. In addition, the tunnel 21 is formed in the lead frame conveying unit 11. Therefore, without making the apparatus complex, the reducing or non-oxidizing atmosphere can be provided. Thus, the yield, productivity and quality of fabricated semiconductor devices can be increased. Furthermore, since the assemblage is carried out for every one island of the lead frame, the time at which the semiconductor chip is exposed to the reducing atmosphere is decreased, thereby ensuring the high yield and high reliability.

Figure 3:
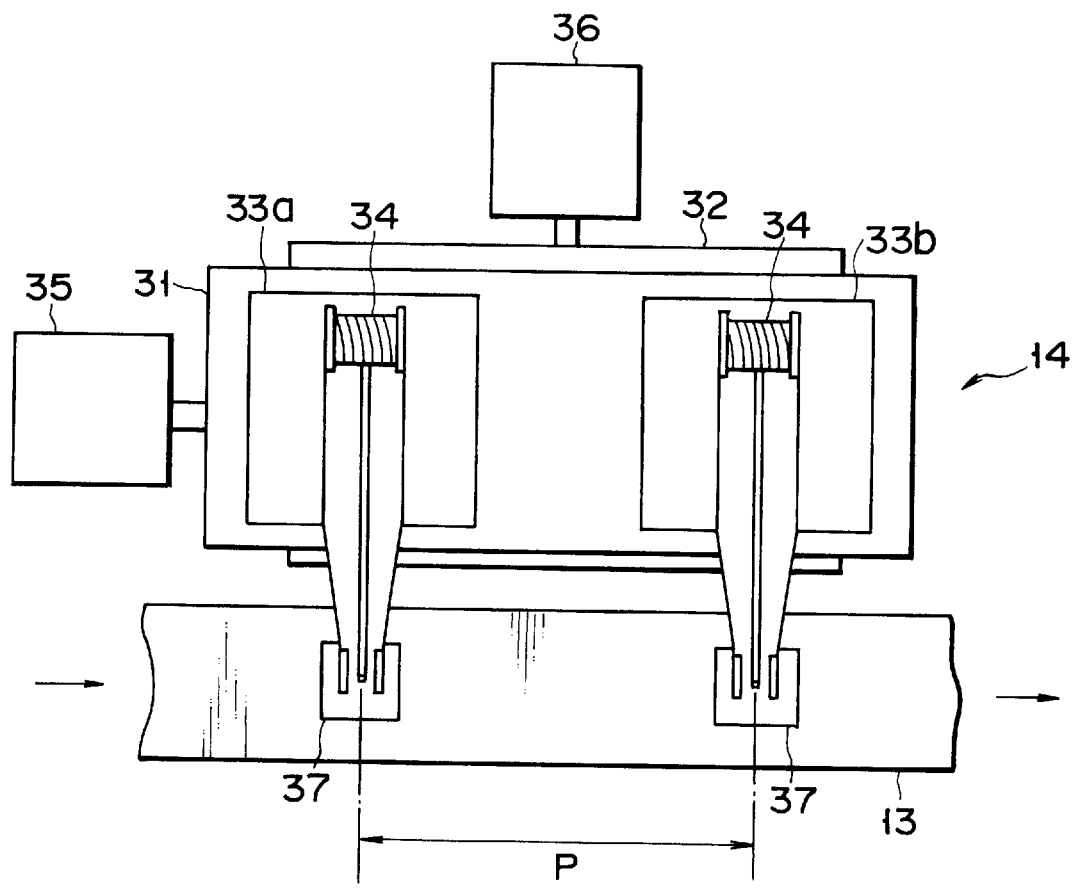
FIG. 3 is a plan view showing an adhesive supply unit of the apparatus shown in FIG. 1.

FIG. 3 shows in detail the adhesive supply unit 14 of the semiconductor manufacturing apparatus shown in FIG. 1.

An X-table 31 and a Y-table 32 are driven, respectively, by an X-driver 35 and a Y-driver 36. A plurality of (e.g. two) wire solder supply units 33a and 33b are disposed at the upper part of the X- and Y-drivers 35 and 36. Each wire solder supply unit 33a, 33b includes a wire spool 34, a wire feeder (not shown), a wire feed adjuster (not shown) and a damper (not shown). When semiconductor chips having the same outer size are treated, the operation of one of the wire solder supply units is stopped or the two wire solder supply units are linkedly operated according to the die bonding speed, thereby increasing the productivity. When semiconductor chips having different outer sizes are treated, the diameters of wires in the wire solder supply units are varied according to the size of the semiconductor chip. It is desirable that the distance between the wire solders of the wire solder supply units 33a, 33b is defined by integer multiples (1P, 2P, . . . ) of the pitch P of the islands 37 of the lead frames 13. The XY-table is provided to feed the solder at the same position as the semiconductor chip to be bonded on the island, and is controlled by the control unit 20.

According to the above structure, since the adhesive supply unit 14 is provided along the conveying path (X-axis) of the lead frame feed unit 11, the solder can be supplied to the islands of the lead frames without using a chuck, and the productivity of automated fabrication can be improved. By providing at least two solder supply units, a plurality of semiconductor chips having different outer sizes can be treated, and the productivity can be further improved. In addition, since the adhesive supply unit 14 can supply solder material to the lead frame 13 in the atmosphere which is adapted to the manufacturing condition, the yield and quality of products can be increased.

Figure 4:
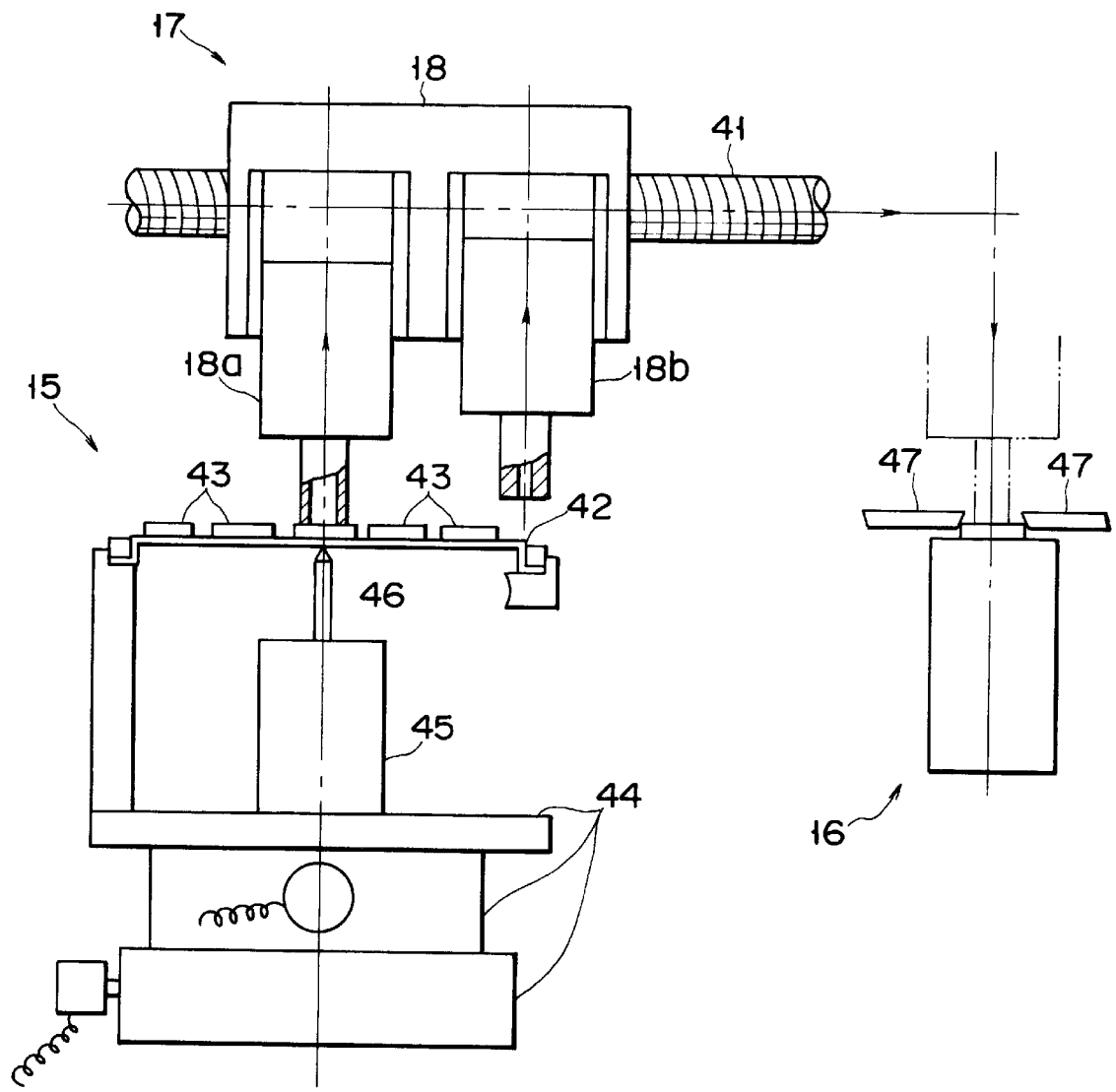
FIG. 4 is a side view showing a chuck transfer unit of the apparatus shown in FIG. 1.
Figure 5:
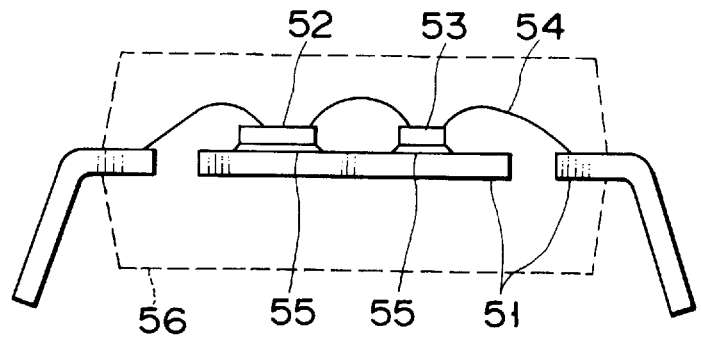
FIG. 5 is a cross-sectional view showing a resin molded semiconductor device which includes a plurality of semiconductor chips.
Figure 6:
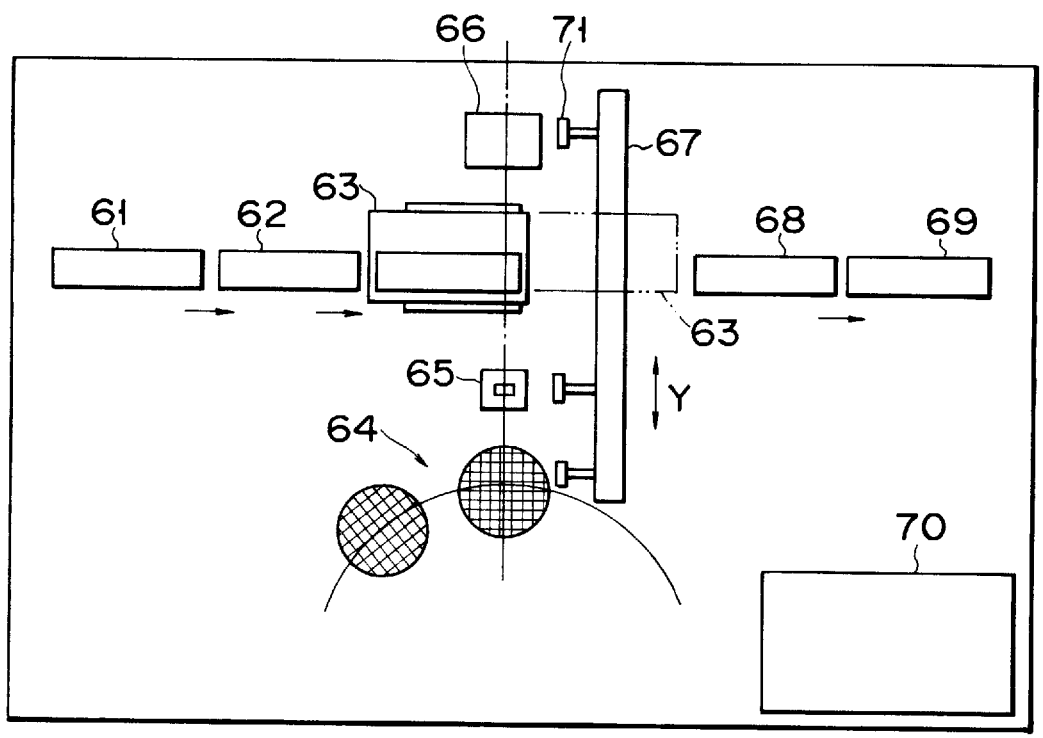
FIG. 6 is a plan view showing a conventional semiconductor manufacturing apparatus.
Figure 7:
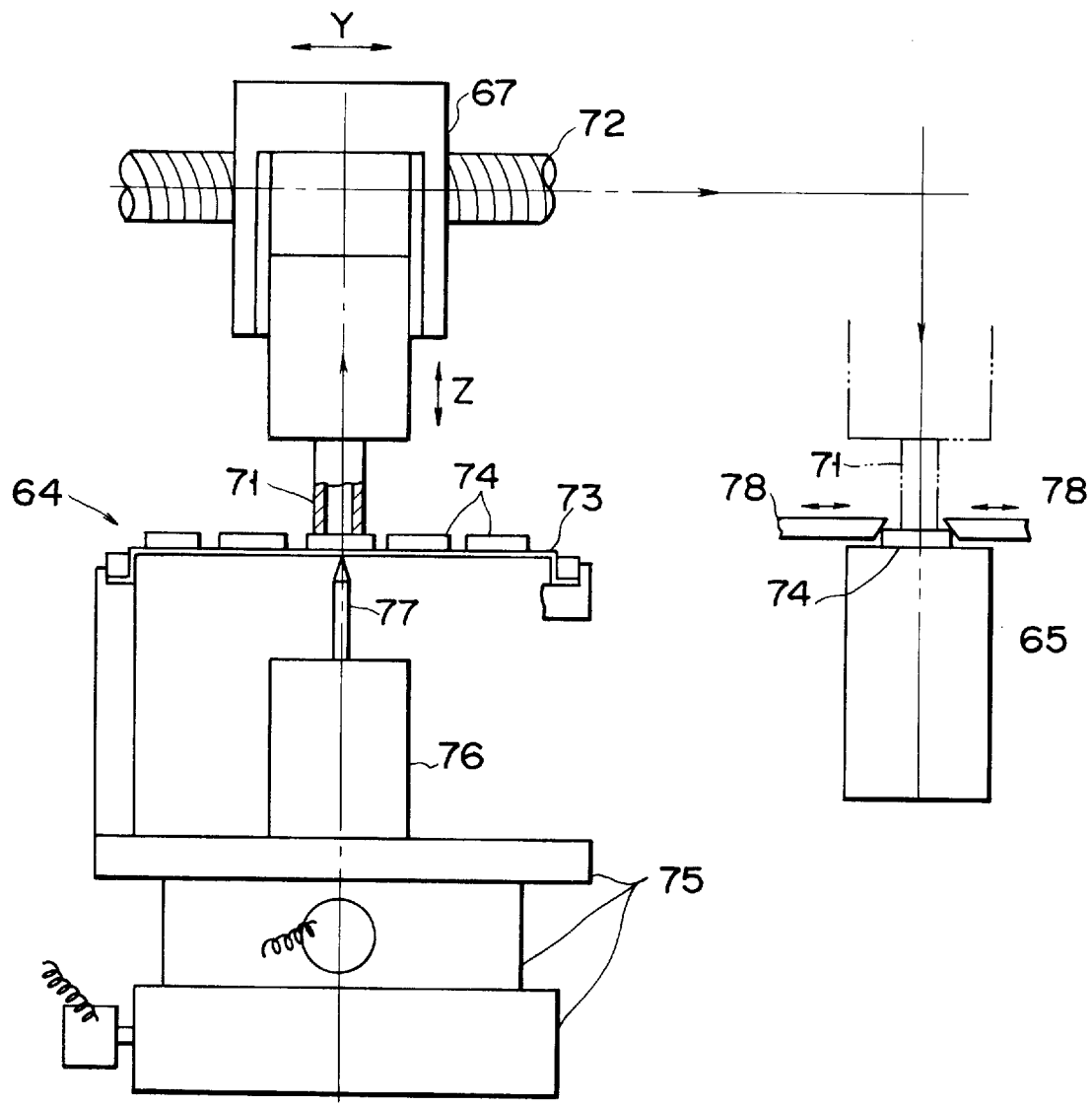
FIG. 7 is a side view showing a semiconductor chip feed unit, an aligning unit and a chuck transfer unit of the apparatus shown in FIG. 6.

FIG. 4 shows in detail the chuck transfer unit 17 of the semiconductor manufacturing apparatus shown in FIG. 1.

Reference numeral 15 denotes a semiconductor chip feed unit, 16 an aligning unit, 18 a chuck holder, 18a and 18b chucks (holders), 41 a ball screw, 42 a sheet, 43 a semiconductor chip, 44 an XY-table, 45 a pushing unit, 46 a pin, and 47 an aligning member.

The chuck transfer unit 17 has a plurality of (e.g. two) chucks 18a and 18b. The operation of the chucks 18a and 18b is controlled by control signals from the control unit 20. Each of the chucks 18a and 18b has a vacuum hole connected to a vacuum line. The diameters of the holes of the chucks can be determined according to the outer sizes of semiconductor chips to be chucked. For example, when the chuck 18a is actuated, the other chuck 18b is located at a position which is free from the chuck 18a.

According to this structure, when a plurality of semiconductor chips having different outer sizes are picked up, each chip can be picked up by the selected optimum chuck according to the outer size of the chip. Thus, a chucking error or damage to an electrode pattern formed on the chip surface can be prevented. In addition, the productivity, yield and quality of products can be improved.

As has been described above, the semiconductor manufacturing apparatus according to the present invention has the following advantages.

The conveying system for the lead frame conveys the lead frame intermittently according to the pitch between the islands of the lead frames. Therefore, the transfer loss time required for treating lead frames on the XY-table is reduced to improve the productivity remarkably. In addition, without making the apparatus complex, the reducing or non-oxidizing atmosphere can be provided in the conveying path. Thus, the yield, productivity and quality of semiconductor devices can be improved. Furthermore, since the assemblage is carried out for every island of the lead frame, the time at which the semiconductor chip is exposed to the reducing atmosphere is decreased, thereby ensuring the high yield and high reliability.

The adhesive supply unit is provided along the conveying path of the lead frame feed unit. Therefore, the solder can be supplied without using a chuck, and the productivity of automated manufacture can be improved. By providing at least two solder supply units, a plurality of semiconductor chips having different outer sizes can be treated, and the productivity can be further improved. In addition, since the adhesive supply unit can supply the solder material to the lead frame in the atmosphere which is adapted to the manufacturing condition, the yield and quality of products can be increased.

When a plurality of semiconductor chips having different outer sizes are picked up, each chip can be picked up by the selected optimum chuck according to the outer size of the chip. Thus, a chucking error or damage to an electrode pattern formed on the chip surface can be prevented. In addition, the productivity, yield and quality of products can be improved.

It is further understood by those skilled in the art that the foregoing description is preferred embodiments and that various changes and modifications may be made in the invention without departing from the spirit and scope thereof.

What is claimed is:

1. An apparatus for automatically mounting first and second semiconductor chips, each having a different outside dimension, on an island of a lead frame, said apparatus comprising:

first supply means for accommodating a plurality of lead frames each having an island;

conveying means for conveying said lead frames from said first supply means in a direction of conveyance, intermittently, and for a distance so that the island of each of said lead frames is stopped at a solder station and at a bonding station, said solder station and said bonding station being spaced by said distance in the direction of conveyance;

said conveying means including a tunnel cavity for maintaining a nonoxidizing atmosphere at and between said solder and bonding stations, said tunnel cavity including a guide member for guiding said lead frames, a cover plate, and a heater block;

second supply means for supplying first and second wire solders to each island at said solder station;

transfer means for transferring the first and second semiconductor chips to each island in that order while said each island is stopped at said bonding station, said transfer means including first and second vacuum chucks corresponding to said outside dimension of each of said first and second semiconductor chips to be mounted; and third supply means for consecutively supplying said first and second semiconductor chips to said transfer means.

2. The apparatus according to claim 1, wherein said conveying means is crossed by said transfer means.

3. The apparatus according to claim 1, wherein said first and second semiconductor chips are oriented by an aligning means, respectively.

4. The apparatus according to claim 1 and further including control means for controlling operations of said first supply means, said conveying means, said second supply means, said third supply means, and said transfer means, respectively.

* * * * *